United States Patent
Kim

(10) Patent No.: US 6,723,653 B1
(45) Date of Patent: Apr. 20, 2004

(54) PROCESS FOR REDUCING DEFECTS IN COPPER-FILLED VIAS AND/OR TRENCHES FORMED IN POROUS LOW-K DIELECTRIC MATERIAL

(75) Inventor: Yong-Bae Kim, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 47 days.

(21) Appl. No.: 09/932,527

(22) Filed: Aug. 17, 2001

(51) Int. Cl.[7] .................................................. H01L 21/302
(52) U.S. Cl. ........................................ 438/723; 438/725
(58) Field of Search .............................. 438/689, 706, 438/714, 723, 724, 725, 745

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,393,712 A | 2/1995 | Rostoker et al. | 437/238 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,598,026 A | 1/1997 | Kapoor et al. | 257/634 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |

(List continued on next page.)

FOREIGN PATENT DOCUMENTS

| | | | |
|---|---|---|---|
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO 99/41423 | 8/1999 | |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

(List continued on next page.)

Primary Examiner—Kin-Chan Chen
(74) *Attorney, Agent, or Firm*—John P. Taylor

(57) ABSTRACT

Removal of rough edges in punctured or ruptured pores on the walls of an opening, such as a via and/or trench opening, in a layer of porous dielectric material, in an integrated circuit structure, is carried out to permit satisfactory lining of all exposed surfaces of the porous dielectric material with a barrier layer which prevents contact between a copper filler and the porous dielectric material, and facilitates filling of the completely lined punctured/ruptured pore with such copper filler to eliminate void formation. The rough edges of the punctured/ruptured pores are removed by an isotropic etch of the exposed walls of the opening. Preferably, the dielectric material in the porous dielectric material is a low k dielectric material.

12 Claims, 3 Drawing Sheets

U.S. PATENT DOCUMENTS

| | | | | |
|---|---|---|---|---|
| 6,037,248 | A | | 3/2000 | Ahn .......................... 438/619 |
| 6,043,167 | A | | 3/2000 | Lee et al. .................. 438/789 |
| 6,051,073 | A | | 4/2000 | Chu et al. .................. 118/723 |
| 6,051,477 | A | | 4/2000 | Nam .......................... 438/404 |
| 6,066,574 | A | | 5/2000 | You et al. .................. 438/781 |
| 6,103,590 | A | * | 8/2000 | Swanson et al. ............ 438/409 |
| 6,114,259 | A | | 9/2000 | Sukharev et al. ........... 438/789 |
| 6,147,012 | A | | 11/2000 | Sukharev et al. ........... 438/787 |
| 6,153,524 | A | | 11/2000 | Henley et al. .............. 438/691 |
| 6,204,192 | B1 | | 3/2001 | Zhao et al. ................. 438/723 |
| 6,211,092 | B1 | * | 4/2001 | Tang et al. ................. 438/719 |
| 6,232,658 | B1 | | 5/2001 | Catabay et al. ............. 257/701 |
| 6,395,631 | B1 | * | 5/2002 | Xu et al. .................... 438/670 |
| 6,413,852 | B1 | * | 7/2002 | Grill et al. .................. 438/619 |
| 6,432,811 | B1 | * | 8/2002 | Wong ......................... 438/619 |

OTHER PUBLICATIONS

Sugahara, Satoshi, et al., "Chemical Vapor Deposition of CF$_3$—Incorporated Silica Films for Interlayer Dielectric Application", 1999 Joint International Meeting, *Electrochemical Society Meeting Abstracts*, vol. 99–2, 1999, Abstract No. 746.

Bothra, S., et al., "Integration of 0.25 µm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced SiO$_2$ Planarization Using Silane and H$_2$O$_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

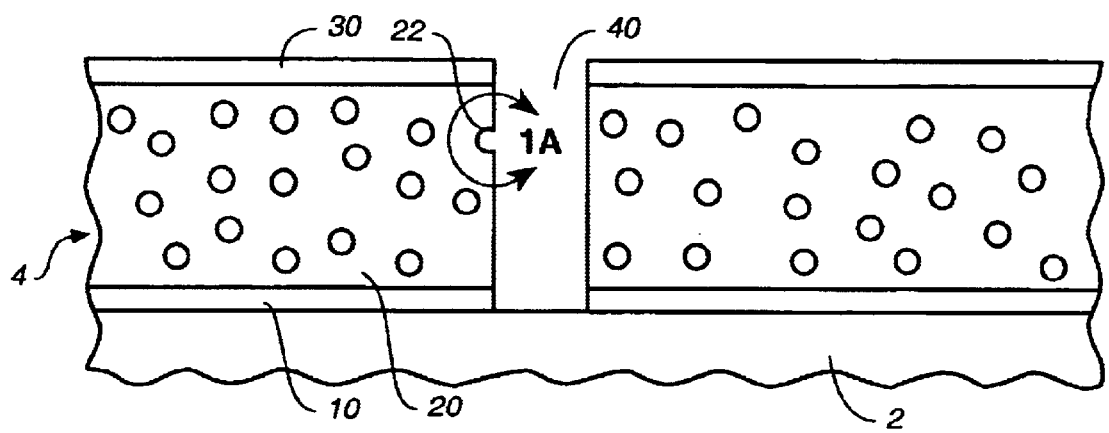
FIG._1 (PRIOR ART)
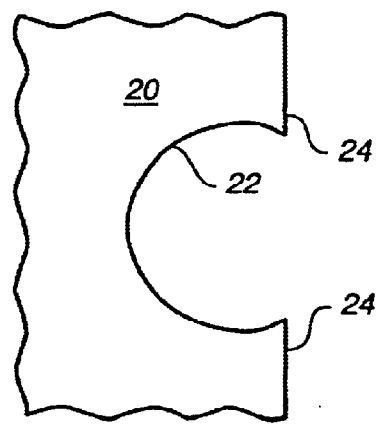
FIG._1A (PRIOR ART)

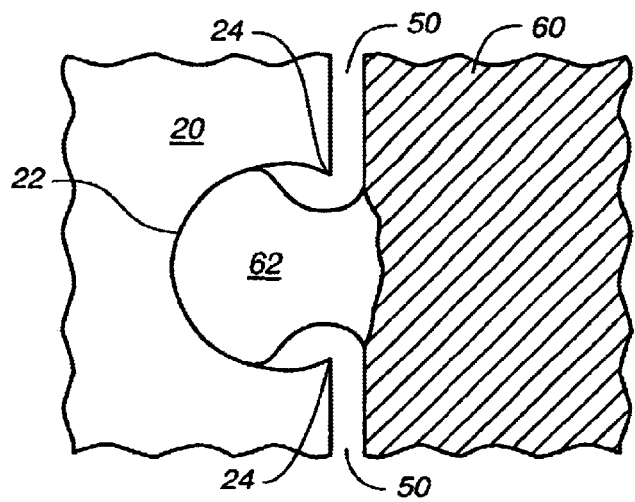
FIG._2
(PRIOR ART)
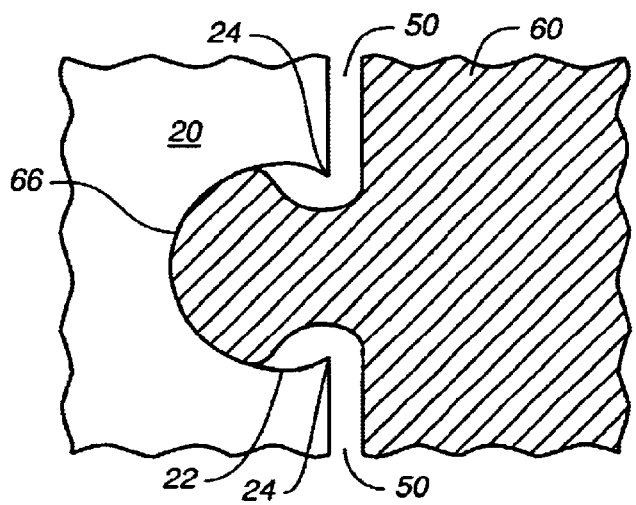
FIG._3
(PRIOR ART)
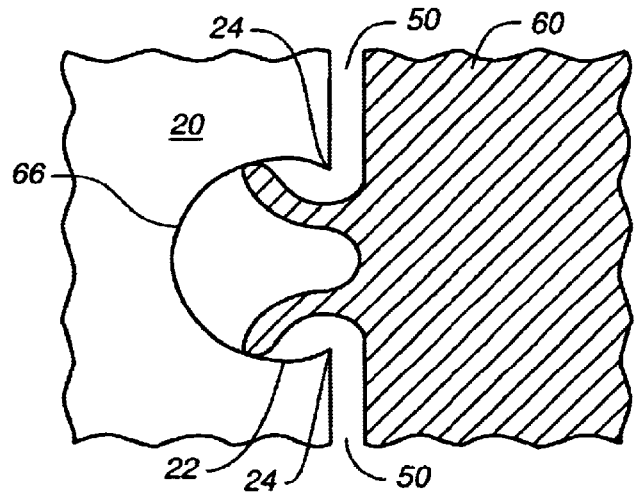
FIG._4
(PRIOR ART)

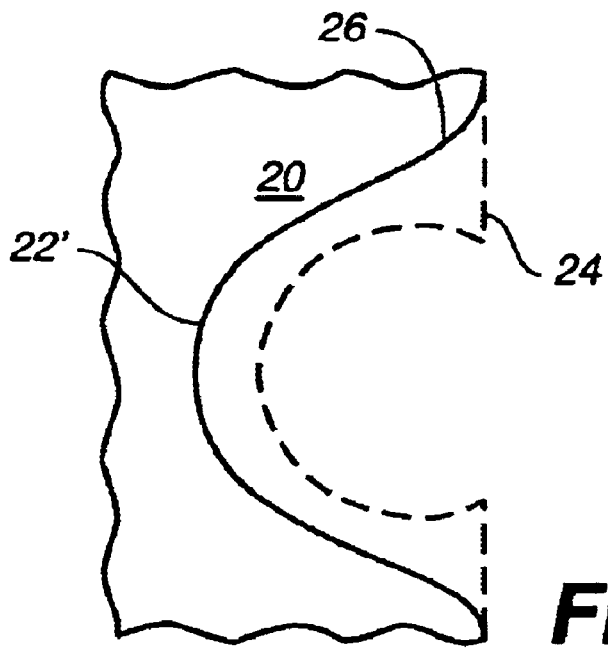
FIG._5
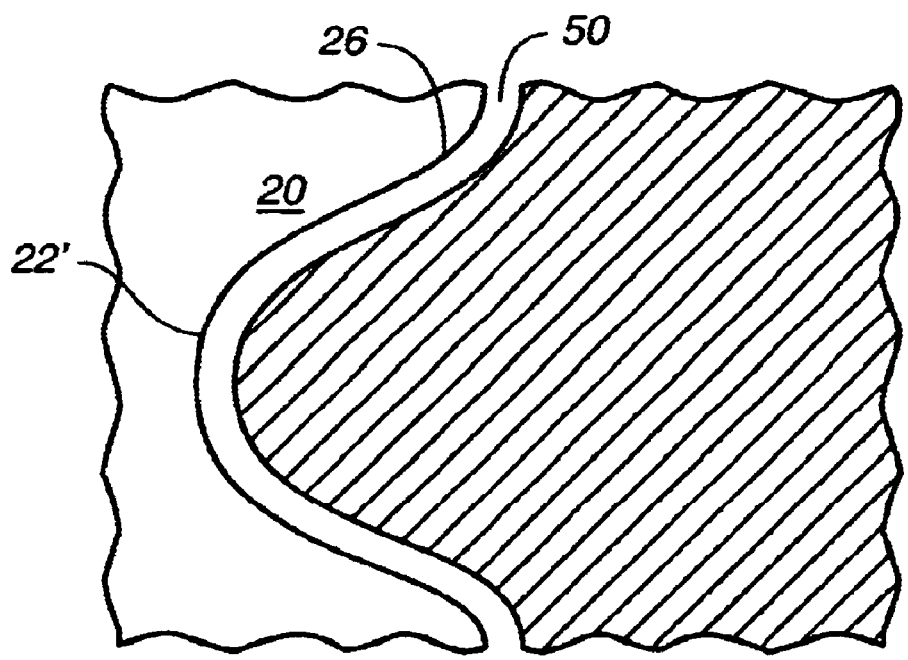
FIG._6

PROCESS FOR REDUCING DEFECTS IN COPPER-FILLED VIAS AND/OR TRENCHES FORMED IN POROUS LOW-K DIELECTRIC MATERIAL

BACKGROUND OF THE INVENTION

1. Field of the Invention

This invention relates to integrated circuit structures having copper-filled trenches and/or vias formed in porous low-k dielectric material. More particularly, the invention relates to an improvement in the process of forming such structures wherein rough edges in the pore wall, caused by trench/via etching, are smoothed to provide a superior barrier liner below copper filled-in trench/via.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled. "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

Another approach to the reduction of capacitance in integrated circuit structures is to lower the dielectric constant (k) by introducing porosity into the dielectric layer. Porous dielectric materials, and methods of making same, are described in Rostoker, Pasch and Kapoor U.S. Pat. No. 5,393,712; Kapoor and Pasch U.S. Pat. No. 5,470,801; Kapoor and Pasch U.S. Pat. No. 5,598,172 (a division of U.S. Pat. No. 5,470,801); and Kapoor and Pasch U.S. Pat. No. 5,864,172 (a continuation of U.S. Pat. No. 5,598,172); all assigned to the assignee of this invention and the subject matter of all of which is hereby incorporated by reference. In these patents, a composite layer is formed on an integrated circuit structure comprising a dielectric material and an extractable material. The extractable material is removed from the composite layer, leaving a porous structure of dielectric material.

The above-mentioned shrinking of integrated circuits and the concurrent ever increasing demands for faster speeds, has also resulted in renewed interest in the use of copper as a filler material for vias and contact openings instead of tungsten, as well as for use in metal lines instead of aluminum because of the well known low electrical resistance of copper, compared to either aluminum or tungsten.

But there are negative aspects to the choice of copper for via filling or in the formation of metal lines. The usual patterning of a blanket-deposited metal layer through a mask to form a pattern of metal lines or interconnects cannot easily be carried out using copper, resulting in the need to first deposit a dielectric layer such as silicon oxide, and then form a series of trenches in the dielectric layer corresponding to the desired pattern of metal lines or interconnects. The trench surfaces are then lined with a diffusion barrier layer or liner (to prevent migration of copper into the dielectric material, as well as to promote adhesion of the filler metal to the trench surfaces), and then filled with copper metal by first forming a copper seed layer over the barrier layer, e.g., by a CVD process, and then filling the remainder of the trench with a blanket deposition of copper, e.g., by a copper plating process.

While the combined use of a porous low-k dielectric material and a copper filler in the trenches and vias etched in such materials can result in the desired reduction in capacitance and enhanced speed, other problems have arisen due apparently to the combined use of a porous dielectric material and a copper filler for the trenches and/or vias etched in such porous dielectric material.

Referring to FIGS. 1 and 1A, an integrated circuit structure, denoted as 2, is shown having a composite layer porous dielectric structure generally indicated at 4 formed thereon comprising a non-porous lower barrier layer 10 of one or more dielectric materials, a porous dielectric layer 20, and an upper non-porous barrier layer 30 of one or more dielectric materials. An opening 40 is shown formed through dielectric layers 10, 20 and 30 to form a trench or via opening in composite layer structure 4.

Formation of such an opening 40 through layers 10, 20, and 30 often results in the opening of one or more pores, such as illustrated pore 22, in porous layer 20, resulting in the formation of pointed edges 24 remaining on the punctured or ruptured pore 22, as best seen in FIG. 1A. When a subsequent barrier liner layer 50, of e.g. tantalum metal, is then formed as a liner over the etched surfaces of the trench/via opening 40 (as required when using copper filler material), the coverage of barrier liner 50 over the damaged pore 22 is inadequate, resulting in either subsequent non-filling of pore 22 with copper filler 60, creating a void 62 as shown in prior art FIG. 2, or a filling of pore 22 with copper filler, as shown in prior art FIG. 3, resulting in direct contact at 66 between copper filler 60 and the porous dielectric material of porous dielectric layer 20, or a combination of FIGS. 2 and 3, as shown in prior art FIG. 4.

The formation of voids resulting from inadequate filling of pore 22, as shown in FIG. 2, can result in a high resistance or disconnection (open) of copper line 60 at this point. The direct contact between copper filler 60 and porous dielectric layer 20 shown in FIGS. 3 and 4 can result in diffusion of copper atoms into porous dielectric layer 20, resulting in degradation of the dielectric properties of porous dielectric layer 20.

It would, therefore, be desirable to provide a structure and process wherein both a porous dielectric material and a copper filler could be used in the same integrated circuit structure without encountering the deleterious effects just discussed above.

SUMMARY OF THE INVENTION

The invention comprises removal of rough edges in punctured or ruptured pores on the walls of an opening, such as a via and/or trench opening, in a layer of porous dielectric material, in an integrated circuit structure, to permit satisfactory lining of all exposed surfaces of the porous dielectric material with a barrier layer which prevents contact between the copper filler and the porous dielectric material, and facilitates filling of the completely lined punctured/ruptured pore with copper filler to eliminate void formation. The rough edges of the punctured/ruptured pores are removed by an isotropic etch of the exposed walls of the opening. This can be accomplished by adding some isotropicity to the etch used to form the trench/via opening. Preferably, however, the isotropic etch is carried out in a separate step to permit more control of the isotropic etch. The resulting structure with smoothed edges on the opened pore permits the formation of a barrier liner layer of adequate thickness over all of the exposed surfaces of the via and/or trench opening before filling of the opening with copper filler material.

BRIEF DESCRIPTION OF THE DRAWINGS

FIG. 1 is a fragmentary vertical cross-sectional view of a prior art composite of dielectric layers including a porous dielectric layer with a trench or via opening etched through the composite of dielectric layers which opens one of the pores in the porous dielectric layer.

FIG. 1A is an enlarged view of the portion of prior art FIG. 1 circled to better illustrate the rough edges caused by the puncture/rupture of the pore by the formation of the trench/via opening.

FIG. 2 is a fragmentary vertical cross-sectional view of the prior art structure of FIG. 1A after formation of a barrier layer over exposed surfaces of the trench/via opening in the porous dielectric layer and filling of the trench/via opening with copper, showing inadequate copper filling of the pore resulting in void formation.

FIG. 3 is a fragmentary vertical cross-sectional view of the prior art structure of FIG. 1A after formation of a barrier layer over exposed surfaces of the trench/via opening in the porous dielectric layer and filling of trench/via opening with copper, showing direct contact between the copper filler and the porous dielectric surface.

FIG. 4 is a fragmentary vertical cross-sectional view of the prior art structure of FIG. 1A after formation of a barrier layer over exposed surfaces of the trench/via opening in the porous dielectric layer and filling of the trench/via opening with copper, showing inadequate copper filling of the pore resulting in void formation, as also seen in FIG. 2, as well as showing direct contact between the copper filler and the porous dielectric surface, as also seen in FIG. 3.

FIG. 5 is a fragmentary vertical cross-sectional view of the structure of prior art FIG. 1A after isotropic etching of the exposed surfaces of the trench/via opening in accordance with invention to remove the rough edges of the punctured/ruptured pore, with original profile (before isotropic etch) shown in dotted lines.

FIG. 6 is a fragmentary vertical cross-sectional view of the structure of FIG. 5 after lining of the opening with barrier layer and filling with copper, showing complete filling of the ruptured/punctured pore with copper (no void formation) and no direct contact between the copper filler and exposed surfaces of the porous dielectric layer.

DETAILED DESCRIPTION OF THE INVENTION

The invention comprises removal of rough edges in punctured or ruptured pores on the walls of an opening, such as a via and/or trench opening, in a layer of porous dielectric material, in an integrated circuit structure, to permit satisfactory lining of all exposed surfaces of the porous dielectric material with a barrier layer which prevents contact between a copper filler and the porous dielectric material, and facilitates filling of the completely lined punctured/ruptured pore with such copper filler to eliminate void formation. The rough edges of the punctured/ruptured pores are removed by an isotropic etch of the exposed walls of the opening. This can be accomplished by adding some isotropicity to the etch used to form the trench/via opening. Preferably, however, the isotropic etch is carried out in a separate step to permit more control of the isotropic etch. The resulting structure with smoothed edges on the opened pore permits the formation of a barrier liner layer of adequate thickness over all of the exposed surfaces of the via and/or trench opening before filling of the opening with copper filler material. Preferably, the dielectric material in the porous dielectric material is a low k dielectric material.

By use of the term "low k dielectric material" is meant a dielectric material having a dielectric constant k which is below 4.0, preferably below 3.5, and most preferably below 3.0.

The porous dielectric material may comprise a porous inorganic dielectric material such as, for example, porous silicon oxide or porous silicon nitride or porous aluminum oxide, as described in previously cited U.S. Pat. Nos. 5,393,712; 5,470,801; 5,598,172; and 5,864,172. The porous dielectric material may also comprise an organic dielectric material such as IBM SILK.

The low k dielectric material referred to herein may comprise a carbon-doped silicon oxide dielectric material, formed as the reaction product of an oxidizing agent, such as, for example, $O_2$, $O_3$, NO, $NO_2$, or $H_2O_2$, or mixtures of same and an organo-substituted silane. Such a low k carbon-doped silicon oxide dielectric material, for example, may be formed using methyl silane ($CH_3SiH_3$), as described in the previously referenced Peters and McClatchie et al. articles. Alternatively, the low k carbon-doped silicon oxide dielectric material may also comprise, for example, the reaction product of an oxidizig agent with a multiple carbon-substituted silane such as described in U.S. Pat. No. 6,303,047, issued Oct. 16, 2001, assigned to the assignee of this invention, the subject matter of which is hereby is incorporated by reference. The low k carbon-doped silicon oxide dielectric material might also comprise the reaction product of an oxidizing agent and an organofluoro silane such as described in U.S. Pat. No. 6,365,528, issued Apr. 2, 2002 and in U.S. Pat. No. 6,572,925. issued Jun. 3, 2003 and Ser. Nos. 09/792,685 and 09/792,691. All of the latter three of the preceding cases were filed on Feb. 23, 2001. All four of these cases are assigned to the assignee of this application, and the subject matter of all four cases is hereby incorporated by reference.

The isotropic etch used to remove the rough edges of punctured or ruptured pores in the openings etched in the porous dielectric material may be carried out in the same etch chamber immediately following the anisotropic etch step used to form the openings in the porous dielectric material to thereby inhibit initial creation of (or remove) the undesired rough edges This may be accomplished by changing from an RIE rf bias mode of anisotropic etching (which is used to form the via or trench opening) to a remote plasma mode such as a microwave plasma generation mode to provide an isotropic etch for a period of typically from about 5 to about 60 seconds to thereby remove the rough edges of the opened pores in the sidewall of the via or trench. The amount of time needed to provide sufficient isotropic etching to remove the rough edges of the ruptured pore or pores may be determined empirically.

It should be noted that particularly when the etch is changed in the same apparatus from an anisotropic etch using an RIE etcher with an rf bias, to an isotropic etch with a remote plasma generator, it is preferably to dilute the etchant gases used to form the etch plasma used to anisotropically etch the openings in the porous dielectric material and-then isotropically etch away the rough edges. For example, when $NF_3$ or $CF_4$ etchant gases are used to form the etch plasma, some nitrogen or argon may be introduced into the etchant gas flow to dilute the etchant gas and therefore reduce the etch rate to control the process, particularly the isotropic portion of the process, more easily. Without such dilution of the etch gases and resultant reduction in the etch rate, the isotropic etch may be difficult to control, resulting in excessive isotropic etching of the via or trench. Again the exact amount of diluent gas added may be determined empirically.

Preferably, however, to provide better control of the isotropic etching of such rough edges, the isotropic etch of the invention is carried out in a separate or independent step after the step of etching the openings in the porous dielectric layer. This permits the use of a wet step to remove the rough edges in the etched openings in the porous dielectric material. Wet etches may include the use of a diluted HF acid, particularly when the dielectric material comprises a silicon oxide-based dielectric material. Alternatively, when the porous dielectric material comprises an organic material, a suitable organic solvent may be used to smooth the rough edges of the punctured/ruptured pores., e.g., EKC solvent 265, a hydroxy amine-based solvent or EKC 640, an ammonium fluoride-based solvent.

As shown in FIG. 5, the pointed edges 24, shown in prior art FIGS. 1A and 2–4 (and by the dotted lines in FIG. 5), are removed by the process of the invention, leaving instead rounded edges 26 of now enlarged pore 22', as seen in both FIGS. 5 and 6.

After removal of the rough edges from the ruptured/punctured pores in the sidewalls of the via or trench openings etched in the porous dielectric material, barrier liner 50, preferably comprising an electrically conductive material, is deposited over the exposed surfaces of the via or trench openings 40 prior to the step of filling the openings with main electrically conductive filler material 60. When copper is the intended filler material, the barrier layer used to isolate the copper filler material from the dielectric material, to inhibit migration of copper atoms into the dielectric material, may comprise, by way of example and not of limitation, tantalum, tantalum nitride, titanium silicon nitride, tungsten, tungsten nitride, titanium, and titanium nitride. After formation of the liner of barrier material over the exposed surfaces of the porous dielectric material in the openings, the openings may be filled with electrically conductive material such as aluminum, tungsten, or copper; although copper is preferred, due to its high conductivity, resulting in the structure shown in FIG. 6, with neither voids nor direct contact between the copper filler and the dielectric material due to inadequate lining of the ruptured pore.

After carrying out the steps of removal of the rough edges in the openings in the porous dielectric material, in accordance with the invention, and the subsequent steps of lining the openings with a suitable barrier material, and then filling the lined openings with an electrically conductive filler material, one can then determine the successful removal of the rough edges of the opened (ruptured/punctured) pores in the openings in the porous dielectric material by any one or more tests. Determination of the presence or successful removal of such rough edges by one of the above-described procedures may be made by either an electrical test measurement such as a resistance measurement or an electromigration (EM) test; or by physical observation such as by transmission electron microscopy (TEM) or by scanning electron microscopy (SEM).

Having thus described the invention what is claimed is:

1. A process for removal of rough edges in punctured or ruptured pores on the walls of an opening in a layer of porous dielectric material in an integrated circuit structure which comprises:
   a) providing a layer of porous dielectric material having etched therein openings suitable for use as vias and/or trenches;
   b) then, after said step of providing said layer of us dielectric material having etched therein openings, isotropically etching, with a dry etch, rough edges of exposed pores in said openings in said porous dielectric layer, in a separate step, to remove said rough edges prior to filling said openings with electrically conductive material.

2. The process of claim 1 wherein said step of isotropically etching said rough edges to remove them further comprises isotropically etching exposed walls of said openings.

3. The process of claim 1 wherein said step of isotropically etching said rough edges with a dry etch to remove them after said step of forming said openings further comprises diluting the etchant gas in said dry etch to therefore reduce the etch rate to control the isotropic etching to smooth said rough edges.

4. The process of claim 1 including the further steps of:
   a) forming a liner of electrically conductive barrier over exposed surfaces of said openings; and
   b) then filling said lined openings with copper filler material.

5. The process of claim 4 wherein said electrically conductive filler material is selected from the group consisting of: tantalum, tantalum nitride, titanium silicon nitride, tungsten, tungsten nitride, titanium, and titanium nitride.

6. The process of claim 1 wherein the dielectric material in said layer of porous dielectric material has a dielectric constant below about 3.5.

7. A process for removal of rough edges in punctured or ruptured pores on the walls of an opening in a layer of porous dielectric material having a dielectric constant below about 3.5 in an integrated circuit structure which comprises;
   a) providing a layer of porous dielectric material having etched therein openings suitable for use as vias and/or trenches;
   b) then isotropically etching with a dry etch rough edges of exposed pores in said openings in said porous dielectric layer to remove said rough edges prior to filling said openings with electrically conductive material.

8. A process for removal of rough edges in punctured or ruptured pores on the walls of an opening in a layer of porous dielectric material in an integrated circuit structure which comprises:

a) anisotropically etching openings in a layer of porous dielectric material suitable for use as vias and/or trenches;

b) then isotropically etching, with a dry etch, rough edges of exposed pores in said openings in said porous dielectric layer after said step of anisotropically etching said openings, whereby remove said rough edges are removed from said openings prior to filling said openings with electrically conductive material; and c) controlling said isotropic etching to smooth said rough edges by diluting the etchant gas in said dry etch to therefore reduce the etch rate.

9. The process of claim 8 wherein the dielectric material in said layer of porous dielectric material has a dielectric constant below about 3.5.

10. A process for removal of rough edges in punctured or rupture pores on the walls of an opening in a layer of porous dielectric material in an integrated circuit structure which comprises:

a) anisotropically etching openings in a layer of porous dielectric material, said openings suitable for use as vias and/or trenches;

b) then isotropically etching for a period of from about 5 seconds to about 60 seconds, in a plasma etcher operating in a remote plasma mode, rough edges of exposed pores in said openings in said porous dielectric layer after said step of anisotropic etching said openings, to remove said rough edges prior to filling said openings with electrically conductive material.

11. The process of claim 10 wherein the dielectric material in said layer of porous dielectric material has a dielectric constant below about 3.5.

12. A process for removal of rough edges in punctured or ruptured pores on the walls of an opening in a layer of porous low k dielectric material in an integrated circuit structure which comprises:

a) in a plasma etcher operating in an RIE mode, anisotropically etching, in a layer of porous low k dielectric material, openings suitable for use as vias and/or trenches;

b) isotropically etching, in a plasma reactor operating in a microwave plasma generation mode, rough edges of exposed pores in said open in said porous dielectric layer to remove said rough edges prior to filling said openings with electrically conductive material;

c) forming a liner of electrically conductive barrier material over exposed surfaces of said openings; and d) then filling said lined openings with copper filler material; whereby said treatment and removal of said rough edges permits satisfactory lining of all exposed surfaces of said porous dielectric material with a barrier layer which prevents contact between said copper filler and said porous dielectric material, and facilitates filling of the completely lined punctured/ruptured pore with copper filler to eliminate void formation.

* * * * *